United States Patent
Ko

(10) Patent No.: US 7,655,526 B2
(45) Date of Patent: Feb. 2, 2010

(54) METHOD FOR MANUFACTURING SEMICONDUCTOR DEVICE

(75) Inventor: Choul Joo Ko, Seongnam-si (KR)

(73) Assignee: Dongbu Electronics Co., Ltd., Seoul (KR)

( * ) Notice: Subject to any disclaimer, the term of this patent is extended or adjusted under 35 U.S.C. 154(b) by 361 days.

(21) Appl. No.: 11/638,110

(22) Filed: Dec. 12, 2006

(65) Prior Publication Data

US 2007/0161249 A1     Jul. 12, 2007

(30) Foreign Application Priority Data

Dec. 28, 2005   (KR) .................... 10-2005-0132334

(51) Int. Cl.
*H01L 21/331*     (2006.01)
(52) U.S. Cl. .............. 438/305; 438/369; 438/373; 438/514; 438/519
(58) Field of Classification Search ........... 438/369, 438/373, 514, 519, 527, 275, 305; 257/395
See application file for complete search history.

(56) References Cited

U.S. PATENT DOCUMENTS

| 6,010,926 | A | 1/2000 | Rho et al. |
| 7,112,837 | B2 * | 9/2006 | Hsu et al. .................. 257/295 |
| 2005/0151207 | A1 * | 7/2005 | Moscatelli et al. .......... 257/395 |
| 2005/0205926 | A1 | 9/2005 | Chen et al. |

FOREIGN PATENT DOCUMENTS

KR   10-2005-0101616 A     10/2005

OTHER PUBLICATIONS

Ki Ju Baek; "Method of Manufacturing Power Mosfet Using Enhanced Arrangement of LDD Region for Reducing On-Resistance without Degradation of Breakdown Voltage Characteristics"; Korean Patent Abstracts; Publication No. 1020050101616 A; Publication Date: Oct. 25, 2005; Korean Intellectual Property Office, Republic of Korea.

Korean Office Action dated Nov. 14, 2006; Korean Patent Application No. 10-2005-0132334; Korean Intellectual Property Office, Republic of Korea.

* cited by examiner

*Primary Examiner*—Dung A. Le
(74) *Attorney, Agent, or Firm*—The Law Offices of Andrew D. Fortney; Andrew D. Fortney; Sharon E. Brown Turner

(57) ABSTRACT

Disclosed is a method for manufacturing a semiconductor device. The method for manufacturing a semiconductor device includes the steps of forming a gate electrode on a semiconductor substrate, forming a drift area in the semiconductor substrate by implanting a dopant using the gate electrode as a mask, forming a sidewall spacer at sides of the gate electrode, and forming a source/drain area in the semiconductor substrate by implanting a dopant using the gate electrode and the sidewall spacer as a mask.

19 Claims, 4 Drawing Sheets

METHOD FOR MANUFACTURING SEMICONDUCTOR DEVICE

BACKGROUND OF THE INVENTION

1. Field of the Invention

The present invention relates to a method for manufacturing a semiconductor device.

2. Description of the Prior Art

Generally, a core semiconductor device is supplied with power less than or equal to 3.3V in order to reduce power consumption and ensure reliability. However, such devices are generally connected to peripheral devices, which may receive a different power supply, in one system.

Further, since the peripheral devices are supplied with a high voltage of 5V or above, many integrated circuits (IC's) include a high-voltage transistor to support a high input voltage supplied from an exterior.

Such a high-voltage transistor has the same structure as that of a normal (e.g., low-voltage) MOS transistor, and can be formed substantially simultaneously with the low-voltage transistor in-situ.

Meanwhile, certain bi-directional high-voltage devices having an operational level of about 13.5V can be integrated in a chip together with a low-voltage device. Such a high-voltage device can be used for an output terminal of a data driver IC for a liquid crystal display (LCD) or an organic luminescence electro display (OLED). Thus, the bi-directional high-voltage device must be flexibly available for a low-voltage operation and have a superior analog output characteristic.

In particular, an exemplary number of output terminals of one display driver IC can be from 240 to 640, and the uniformity of the output terminals directly exerts an influence upon the uniformity of the display quality, so uniformity of the electrical characteristics of the output terminal is a very important factor.

FIG. 1 is a sectional view showing a conventional semiconductor device.

As shown in FIG. 1, a conventional high-voltage semiconductor device may include a semiconductor substrate 1, a high-voltage P-well 2 provided on the semiconductor substrate 1, a field oxide layer 3 for defining an active area, a gate electrode 4 formed in the active area, source/drain areas 6 formed in the semiconductor substrate 1, and drift areas 5 surrounding the source/drain area 6 in order to stabilize a breakdown voltage.

Hereinafter, a conventional method for manufacturing the semiconductor device of FIG. 1 will be described. First, a high-voltage N-well (not shown), a high-voltage P-well 2, a low-voltage N-well (not shown), and a low-voltage P-well (not shown) are formed in the semiconductor substrate 1.

Then, N-drift areas 5 and corresponding P-drift areas (not shown) are formed on the surfaces of the high-voltage P-well 2 and the high-voltage N-well (not shown), respectively.

In addition, after forming the field oxide layer 3 and performing an ion-implantation process for adjusting threshold voltages of high-voltage PMOS transistors, low-voltage NMOS transistors, and low-voltage PMOS transistors, gate oxide layers of the high-voltage and low-voltage transistors are formed.

Then, a gate conductive layer is deposited and patterned, thereby forming the gate electrode 4.

Finally, LDD areas of low-voltage NMOS and PMOS transistors are formed through an ion-implantation process, and then source/drain areas 6 of the high-voltage and low-voltage transistors are formed.

However, the above conventional method has following disadvantages.

Since the drift area has been already realized before the gate electrode is formed, the high-voltage device is not self-aligned. Accordingly, when the channel area is narrowed, voltage differences for various transistor parameters may vary for each semiconductor device.

SUMMARY OF THE INVENTION

Accordingly, the present invention has been made to solve the above-mentioned problems, and an object of the present invention is to provide a method for manufacturing a semiconductor device, capable of obtaining uniform electric characteristics at a high-voltage output terminal based on self-alignment of a drift area, thereby realizing a high-voltage device for a data driver having a self-aligned drift area.

In order to accomplish the object, there is provided a method for manufacturing a semiconductor device, including the steps of forming a gate electrode on a semiconductor substrate, forming a drift area in the semiconductor substrate by implanting a first dopant using the gate electrode as a mask, forming a sidewall spacer at sides of the gate electrode, and forming a source/drain area in the semiconductor substrate by implanting a second dopant using the gate electrode and the sidewall spacer as a mask.

According to another aspect of the present invention, there is provided a method for manufacturing a semiconductor device, including the steps of forming a buffer oxide layer on a semiconductor substrate, depositing a polysilicon layer, an oxide layer, and a first nitride layer on the buffer oxide layer and forming a gate stack by patterning the first nitride layer, the oxide layer, and the polysilicon layer, forming a drift area by implanting a first dopant into the semiconductor substrate using the gate stack as a mask, removing the first nitride layer, depositing a second nitride layer on the semiconductor substrate and forming a sidewall spacer by blanket etching the oxide layer and the second nitride layer, and forming a source/drain area in the semiconductor substrate by implanting a second dopant using the gate electrode and the sidewall spacer as a mask.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Hereinafter, a method for manufacturing the same according to the present invention will be described with reference to the accompanying drawings.

FIGS. 2 to 7 are views showing a method for manufacturing a semiconductor device according to the present invention.

Figure 1:
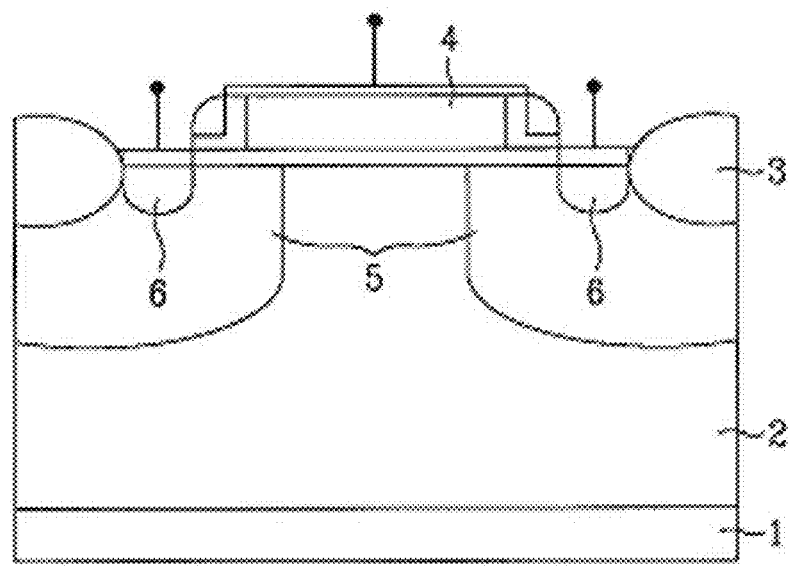
FIG. 1 is a cross-sectional view showing a conventional semiconductor device.
Figure 2:
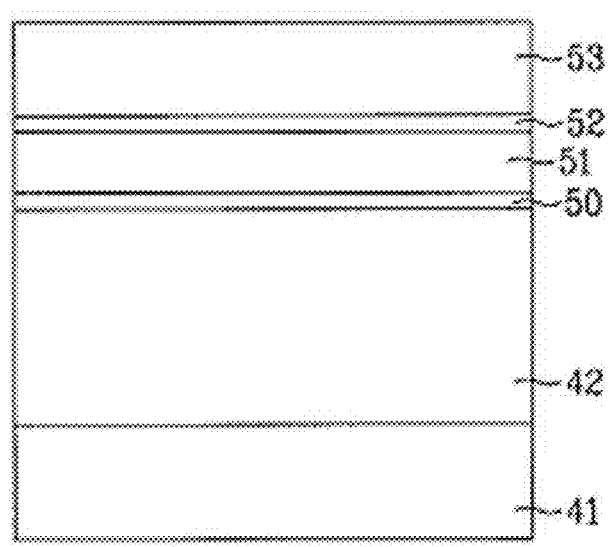
FIGS. 2 to 7 are views showing a method for manufacturing a semiconductor device according to the present invention.

As shown in FIG. 2, after forming a buffer oxide layer 50 on a semiconductor substrate 41, an ion-implantation process is performed using a well-mask, and a high-voltage P-well 42 or a high-voltage N-well (not shown) is formed in the semiconductor substrate 41 through a subsequent annealing process.

An isolation layer (not shown) is formed to define an active area on the semiconductor substrate 41.

In order to form the isolation layer, a pad nitride layer is deposited on the semiconductor substrate 41, and then the pad nitride layer and the buffer oxide layer are patterned such that an isolation area can be exposed. After that, the exposed semiconductor substrate is etched, thereby forming a trench.

Then, an insulating layer is deposited so as to fill the trench, and a chemical mechanical polishing (CMP) process is performed with respect to the insulating layer such that the insulating layer having a predetermined thickness may remain in the trench up to a level of the pad nitride layer, thereby forming a trench-type isolation layer. Thereafter, the pad nitride layer is removed.

Figure 3:
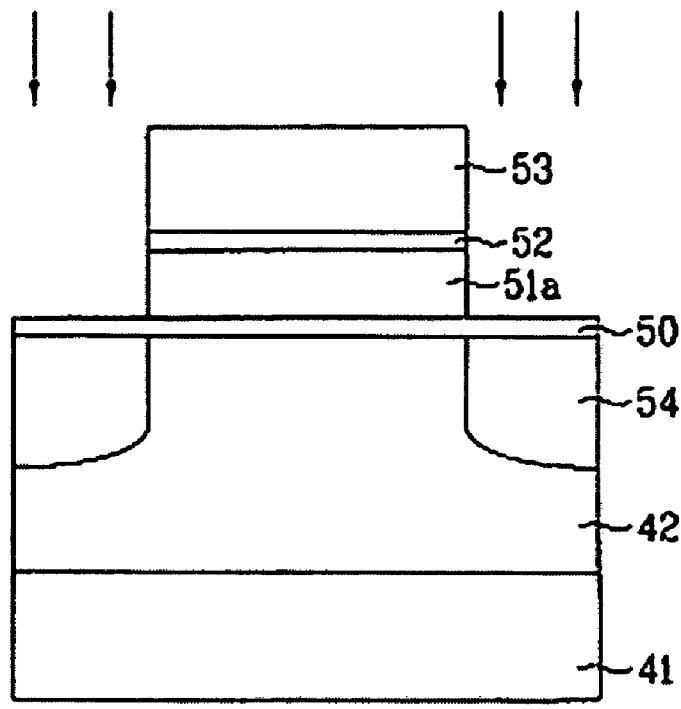

Then, after sequentially forming a polysilicon layer 51, an oxide layer 52, and a first nitride layer 53 on the buffer oxide layer 50, the polysilicon layer 51, the oxide layer 52, and the first nitride layer 53 are patterned and etched (in reverse order) as shown in FIG. 3. Alternatively, prior to forming the polysilicon layer 51, oxide layer 52, and first nitride layer 53, the buffer oxide layer 50 may be removed and replaced with a gate oxide layer (which can be deposited (e.g., by CVD) and densified (e.g., by [rapid thermal] annealing), or grown by wet or dry thermal oxidation).

A gate stack is formed by the patterned polysilicon layer 51, oxide layer 52, and first nitride layer 53.

At this time, the polysilicon layer 51, the oxide layer 52, and the first nitride layer 53 may be etched by a dry etching process, and the patterned polysilicon layer 51 becomes a gate electrode 51a.

Then, dopants are implanted into the semiconductor substrate 41 using the patterned gate electrode 51a, oxide layer 52, and first nitride layer 53 as an ion-implantation mask, thereby forming a drift area 54. In detail, the gate stack including the gate electrode 51a, the oxide layer 52, and the first nitride layer 53 are used as the ion-implantation mask.

An N-drift area is formed in the high-voltage P-well, and a P-drift area is formed in the high-voltage N-well. Relative to a subsequent source/drain implant step, the drift implantation is performed at a relatively high energy (or a similar energy but with a dopant having a lower mass) and relatively low dose, so that the drift implant has a maximum depth greater than that of the subsequent source/drain implant, but the subsequent source/drain implant has a dominant electrical effect in the region where it is formed.

In this case, since another drive-in process is not necessary to form the drift area, the drift area may not exert great influence upon a CMOS transistor.

In particular, the drift area 54 according to the present invention is formed by implanting dopants after forming the gate electrode 51a.

Figure 4:
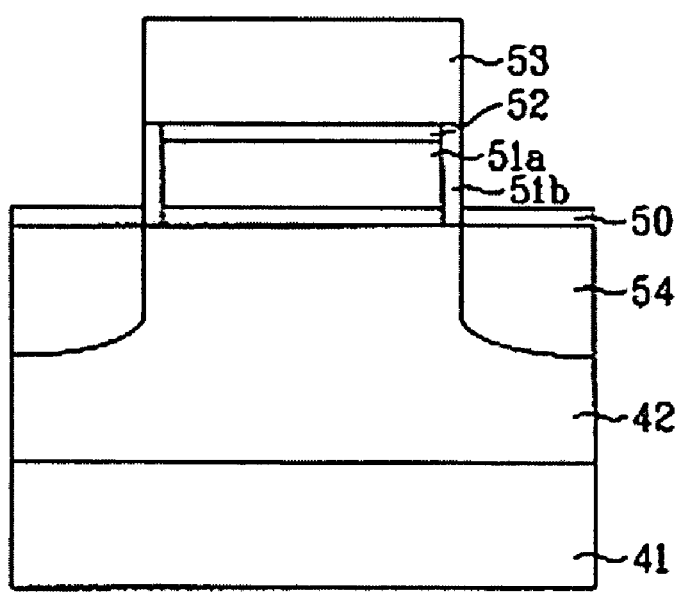

Referring to FIG. 4, an oxidation process is performed with respect to the gate electrode 51a, thereby forming a sidewall oxide layer 51b at both sides of the gate electrode 51a. In detail, as the gate electrode 51a is oxidized, the sidewall oxide layer 51b having a predetermined thickness is formed at exposed sides of the gate electrode 51a.

In this case, since oxide layers have been already formed at upper and lower portions of the gate electrode 51a, oxidization mainly occurs at sides of the gate electrode 51a.

Figure 5:
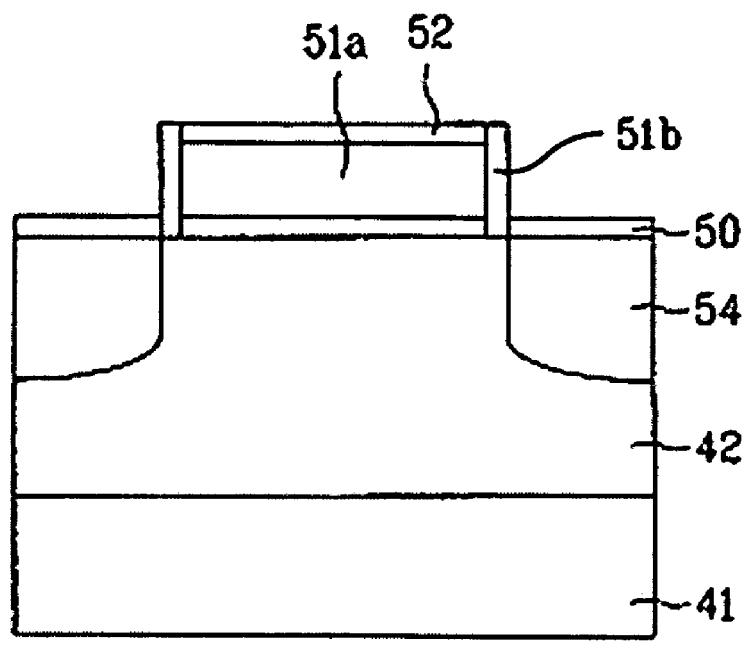

Referring to FIG. 5, if a wet etching process is performed using a material having high etching selectivity for etching the first nitride layer 53 relative to the oxide layer 52, essentially only the first nitride layer 53 may be removed, and the oxide layer 52 and the sidewall oxide layer 51b may remain.

In detail, one material having a high etching selectivity for nitride includes $H_3PO_4$ (e.g., aqueous [optionally, concentrated] $H_3PO_4$, which may be heated to a temperature of up to about 80° C. during use). If the wet etching process is performed using (aqueous) $H_3PO_4$, since $H_3PO_4$ has an etching selectivity of $SiO_2$:nitride layer=0.5:45, it is possible to remove the nitride layer while minimizing the damage to the $SiO_2$.

Thus, it is possible to realize a self-aligned drift area.

Figure 6:
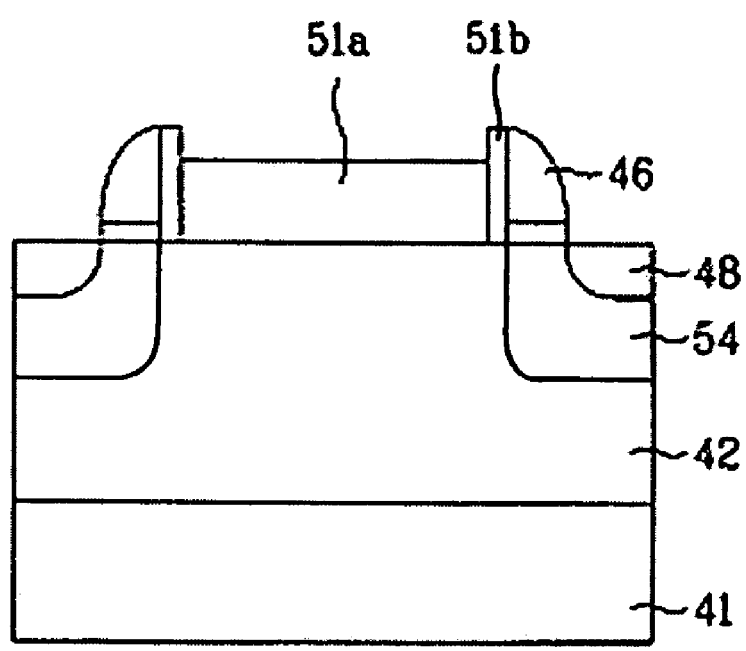

Referring to FIG. 6, a material (e.g., a nitride layer) having etching selectivity different from that of the oxide layer 52 is formed on the semiconductor substrate, and the second nitride layer and the oxide layer 52 are subject to a blanket etching process (e.g., anisotropic etching, or dry plasma etching), thereby forming a sidewall spacer 46 at sides of the gate electrode 51a.

Then, one or more dopants are implanted at a high density using the gate electrode 51a and the sidewall spacer 46 as a mask, thereby forming source/drain areas 48 on the surface of the semiconductor substrate at opposite sides of the gate electrode 51a and sidewall spacer 46. Before or after the source/drain implant step, oxide layer 52 may be removed by wet or dry etching. An upper portion of sidewall oxide 51b corresponding to a thickness of oxide layer 52 may also be removed, along with exposed portions of buffer/gate oxide 50.

Accordingly, a trenched channel is formed.

Figure 7:
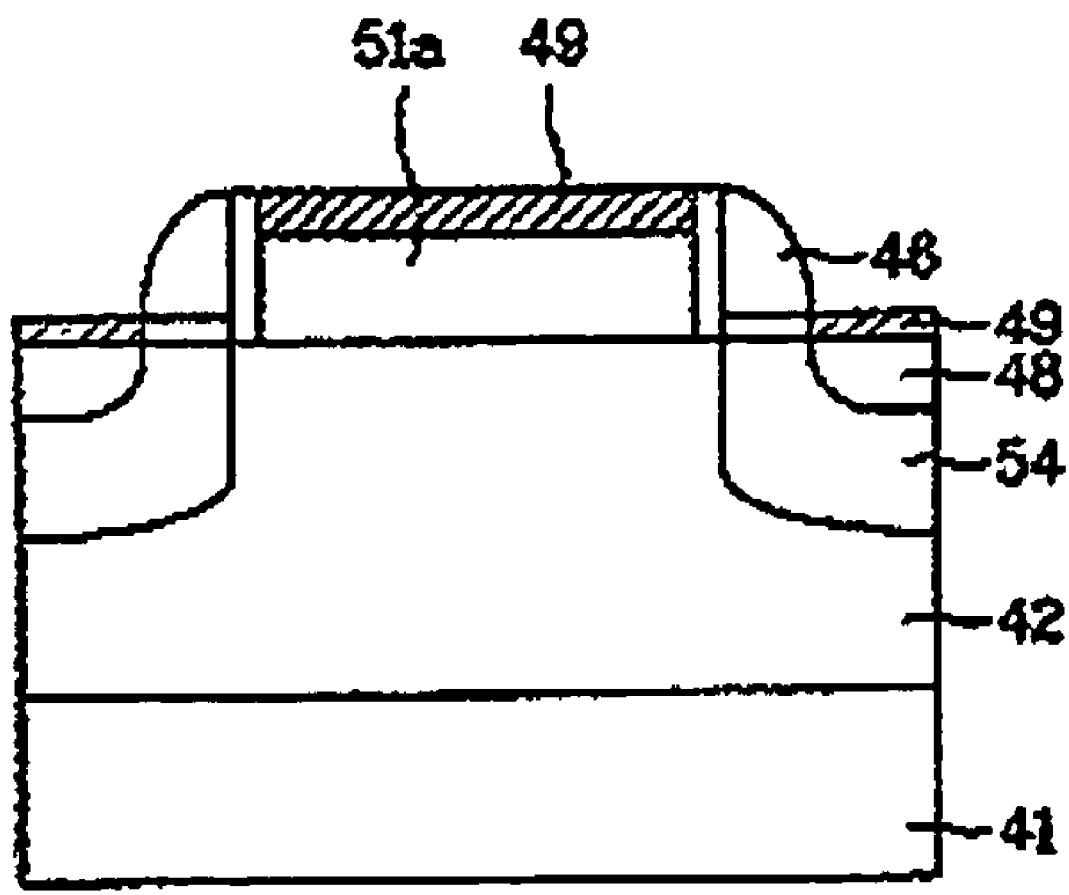

Referring to FIG. 7, a salicide layer 49 may be formed on the surface of the gate electrode 51a and the source/drain area 48 through a salicide process or a silicide process, thereby obtaining a high-voltage transistor according to the present invention.

Thereafter, although they are not shown in FIG. 7, a series of following processes including contact and wiring processes is performed.

As described above, according to an embodiment of the present invention, the drift area is formed after forming the gate electrode, so that it is possible to prevent variations in the threshold voltage (ΔVt) across the high-voltage transistors from rising to unacceptable levels, even if a channel area is narrowed.

In addition, the drift area can be self-aligned to the gate electrode, and the channel area can be more largely and/or uniformly formed.

Further, since the channel area of a high-integrated device is enlarged, it is possible to obtain uniform electrical characteristics for an output terminal of a display driver IC.

In addition, since the drift area is formed by implanting a dopant using the gate electrode as a mask, it is unnecessary to perform an additional mask process for forming the drift area.

Although a preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. A method for manufacturing a semiconductor device, the method comprising the steps of:
   forming a gate electrode on a semiconductor substrate by patterning a layer containing polysilicon;
   forming a drift area in the semiconductor substrate by implanting one or more first dopants using the gate electrode as a mask;

forming a sidewall oxide layer at sides of the gate electrode by oxidizing the gate electrode after forming the drift area;

forming a sidewall spacer at sides of the gate electrode; and forming a source/drain area in the semiconductor substrate by implanting one or more second dopants using the gate electrode and the sidewall spacer as a mask.

2. The method as claimed in claim 1, wherein the sidewall oxide layer is formed before the sidewall spacer.

3. The method as claimed in claim 1, wherein the step of forming the gate electrode includes the steps of:

depositing a polysilicon layer, an oxide layer, and a nitride layer on the semiconductor substrate; and sequentially etching the nitride layer, the oxide layer, and the polysilicon layer in a pattern of the gate electrode.

4. The method as claimed in claim 3, comprising dry etching the nitride layer, the oxide layer, and the polysilicon layer.

5. The method as claimed in claim 1, further comprising a step of forming a high-voltage P-well on the semiconductor substrate before forming the gate electrode, wherein forming the drift area comprises implanting an N-dopant.

6. The method as claimed in claim 1, further comprising a step of forming a high-voltage N-well on the semiconductor substrate before forming the gate electrode, wherein forming the drift area comprises implanting a P-dopant.

7. The method as claimed in claim 1, wherein the step of forming the sidewall spacer includes the steps of:

depositing a nitride layer on the semiconductor substrate including the gate electrode; and blanket etching the nitride layer.

8. The method as claimed in claim 1, further comprising a step of forming a salicide layer on a surface of the gate electrode and the source/drain area after forming the source/drain area.

9. The method as claimed in claim 1, wherein the drift area implant has a maximum depth greater than that of the source/drain area implant.

10. A method for manufacturing a semiconductor device, the method comprising the steps of:

forming a first oxide layer on a semiconductor substrate;

depositing a polysilicon layer, a second oxide layer, and a first nitride layer on the first oxide layer and forming a gate stack by patterning the polysilicon layer, the second oxide layer, and the first nitride layer;

forming a drift area by implanting one or more first dopants into the semiconductor substrate using the gate stack as a mask;

removing the first nitride layer;

depositing a second nitride layer on the semiconductor substrate and forming a sidewall spacer by blanket etching the second oxide layer and the second nitride layer; and forming a source/drain area in the semiconductor substrate by implanting one or more second dopants using the gate electrode and the sidewall spacer as a mask.

11. The method as claimed in claim 10, further comprising a step of forming a sidewall oxide layer at sides of the gate electrode by oxidizing the gate electrode, after forming the drift area.

12. The method as claimed in claim 10, wherein removing the first nitride layer comprises a wet etching process using a material having a relatively high etching selectivity for etching the first nitride layer relative to the second oxide layer.

13. The method as claimed in claim 12, wherein the material includes $H_3PO_4$.

14. The method as claimed in claim 13, wherein the material comprises concentrated $H_3PO_4$.

15. The method as claimed in claim 13, wherein the $H_3PO_4$ is heated to a temperature of up to about 80° C. during the etching process.

16. The method as claimed in claim 10, further comprising a step of forming a salicide layer on a surface of the gate electrode and the source/drain area, after forming the source/drain area.

17. The method as claimed in claim 10, wherein the first oxide layer comprises a buffer oxide layer.

18. The method as claimed in claim 10, wherein the first oxide layer comprises a gate oxide layer.

19. The method as claimed in claim 10, wherein blanket etching comprises anisotropic etching or dry plasma etching.

* * * * *